United States Patent [19]

Shigaki et al.

[11] Patent Number: 4,855,895
[45] Date of Patent: Aug. 8, 1989

[54] FREQUENCY DIVIDING APPARATUS FOR HIGH FREQUENCY

[75] Inventors: Masafumi Shigaki, Kawasaki; Hiroshi Kurihara, Tokyo; Hidetoshi Nishi, Yamato, all of Japan

[73] Assignee: Fujitsu Limited, Kawasaki, Japan

[21] Appl. No.: 196,620

[22] Filed: May 19, 1988

[30] Foreign Application Priority Data

May 22, 1987 [JP] Japan .................. 62-125578

[51] Int. Cl.[4] .................................. H02M 5/00
[52] U.S. Cl. .................................. 363/157; 328/16; 455/326
[58] Field of Search ............... 363/157, 159, 164, 165; 455/112, 216, 323, 326; 328/15, 25, 16; 307/271

[56] References Cited

U.S. PATENT DOCUMENTS

| | | | |
|---|---|---|---|
| 4,638,180 | 1/1987 | Sagawa et al. | 328/16 X |
| 4,695,940 | 9/1987 | Rein | 455/326 X |
| 4,730,349 | 3/1988 | Wilhelm et al. | 307/269 X |

FOREIGN PATENT DOCUMENTS

| | | | |
|---|---|---|---|
| 0611727 | 1/1961 | Canada | 363/157 |
| 0172807 | 9/1985 | Japan | 328/15 |
| 0172808 | 9/1985 | Japan | 328/15 |

OTHER PUBLICATIONS

Bowman, "100 MHz Frequency Divider", Wireless World, Aug. 1970, pp. 389-393.

Primary Examiner—William H. Beha, Jr.
Assistant Examiner—Kristine L. Peckman
Attorney, Agent, or Firm—Staas & Halsey

[57] ABSTRACT

A frequency dividing apparatus having an input signal terminal and a divided signal terminal, whereby a high frequency input to the input signal terminal is divided by a mixer having a first input terminal connected to the input signal terminal having a second input terminal, and having an output terminal connected to the divided signal terminal. A frequency divider is provided having a fixed frequency dividing ratio. The frequency divider has an input terminal connected to the divided signal terminal and an output terminal connected to the second input terminal of the mixer.

11 Claims, 7 Drawing Sheets

FREQUENCY DIVIDING APPARATUS FOR HIGH FREQUENCY

BACKGROUND OF THE INVENTION

(1) Field of the Invention

The present invention relates to a high frequency dividing apparatus able to divide an input signal belonging to a microwave band.

(2) Description of the Related Art

Recently, the development of communication systems has allowed vehicles to be provided with a mobile communication system which can be used as a telephone system and a satellite communication system. An automobile equipped with a mobile communication system, e.g., a mobile radio telephone system, is called a mobile station, and this mobile station can communicate not only with a fixed telephone such as a telephone in an office or at home but also mobile stations. This communication is established by radio waves between the mobile station and a land station, and transferred to a conventional telephone system at the land station. The satellite communication system is also established by radio waves between the earth station and the satellite station.

A frequency dividing apparatus to be used in a synthesizer of a communication system such as the mobile communication system or the satellite communication system, must be able to generate various frequencies by dividing an input frequency in a high frequency band, such as a microwave band of approximately from 1 GHz to 30 GHz. Namely, the frequency dividing apparatus in a satellite communication system must divide higher frequencies than those divided by a conventional frequency dividing apparatus.

Known conventional frequency dividing apparatuses are composed of logic circuits, such as flip-flops. FIG. 1 is a typical prior art frequency dividing apparatus composed of flip-flops FF1, FF2, and FF3, and a gate circuit G1. In FIG. 1, the flip-flops FF1, FF2, and FF3 are D-type flip-flops having an input D, input C, and output Q (only FF3 has an input M), and the gate circuit G1 is an OR-gate. Each of the flip-flops FF1, FF2, and FF3 is a ½ frequency divider. The output Q of the flip-flop FF1 is connected to the input D of the flip-flop FF2, the output Q of the flip-flop FF2 is connected to the input D of the flip-flop FF3 and one input of the OR gate G1, and the output Q of the flip-flop FF3 is connected to the other input of the OR gate G1. Namely, the outputs Q of the flip-flops FF2 and FF3 are fedback to the input D of the flip-flop FF1 through the OR gate G1. The inputs C of the flip-flops FF1, FF2, and FF3 are used as a common clock signal to be divided, and the inputs D are used for data or as delay signals. The input M of the flip-flop FF3 is used as a control signal and an output divided from the output Q of the flip-flop FF1 is made ¼ or 1/5 by the control signal.

In the frequency dividing apparatus shown in FIG. 1, a ¼ divided output frequency or a 1/5 divided output frequency can be selected by halting the operation of the flip-flop FF1 intermittently, by controlling the timing of a signal input to the input M of the flip-flop FF3. That is, when the flip-flop FF1 is reset to stop the dividing operation, at a suitable timing obtained by counting the number of clocks, the clock frequency is divided into 1/5 and appears as a divided output of the flip-flop FF1. When the flip-flop FF1 is activated to start the dividing operation, the clock frequency is divided into ¼ and appears as a divided output of the flip-flop FF1.

In the conventional frequency dividing apparatus as described above, the clock signal input in the flip-flop FF1 is returned through the flip-flop FF2, FF3 and the gate G1 with a certain delay time, which depends upon the number of gates the signal must pass through. This limits the speed at which the frequency is divided in the dividing apparatus. In other words, when the dividing speed of the dividing apparatus is low, the dividing apparatus can not divide high frequencies. The prior art frequency dividing apparatus shown in FIG. 1, which can be used in the mobile station of the mobile communication system, is the fastest known frequency divider, but naturally has a certain delay time as described above. Therefore, the maximum dividable frequency of the prior art frequency dividing apparatus is approximately 2.3 GHz. A frequency dividing apparatus which can divide a frequency of more than 2.3 GHz has not been realized until now.

SUMMARY OF THE INVENTION

The object of the present invention is to provide a frequency dividing apparatus for high frequencies which can divide frequencies in the microwave band.

According to the present invention, the frequency dividing apparatus is composed of a divider having a fixed dividing ratio, and a mixer for analogically mixing input signals. This results in a frequency dividing apparatus able to divide higher frequencies than the prior art devices. Further, the present invention provides a frequency dividing apparatus having at least two dividers each having a different fixed dividing ratio, a mixer for analogically mixing input signals, and a circuit changing switch for selecting the divider required. Thus, a more reliable variable frequency divider than the prior art variable frequency dividing apparatus in which the output is varied by adjusting the timing of the counting action.

DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
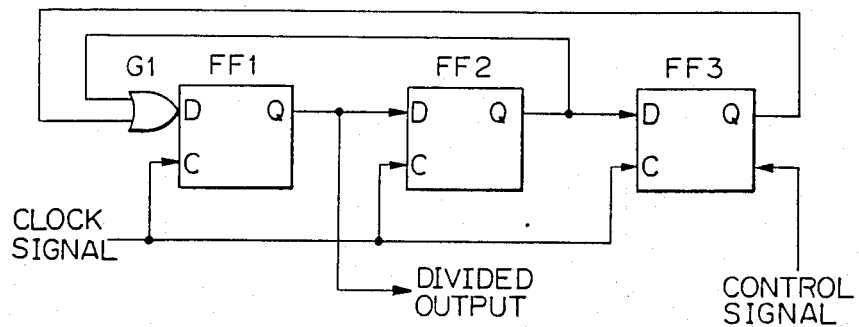
FIG. 1 is a prior art circuit diagram art of a frequency dividing apparatus.
Figure 2:
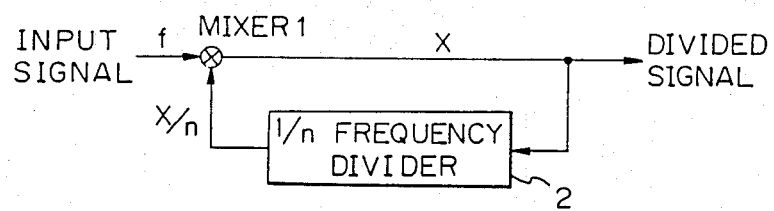
FIG. 2 is a block diagram of a first embodiment of a frequency divider according to the present invention.

FIG. 2 is a block diagram of a first embodiment of a frequency dividing apparatus for high frequencies according to the present invention. The frequency dividing apparatus including a mixer 1 and a frequency divider 2. The mixer 1 has two input terminals for mixing and one output terminal. An input terminal of the frequency divider 2 is connected to the output terminal of the mixer 1 and an output terminal of the frequency divider 2 is connected to one input terminal of the mixer 1. An input signal is applied to the other input terminal of the mixer 1.

In FIG. 2, the following equation will be satisfied by the input and output terminal of the mixer 1, where an input frequency is f, an output frequency is x, and a dividing ratio of the frequency divider 2 is 1/n.

$$x = f - \frac{x}{n} \qquad (2-1)$$

Equation (2-1) can be modified as follows.

$$x = \frac{n}{n+1} f \qquad (2-2)$$

Therefore, the frequency dividing apparatus as shown in FIG. 2 operates as a fractional divider. Note, although the output signal of the mixer 1 includes frequencies of (f+x/n), x/n, and f other than the frequency of (f−x/n). The frequencies x/n and f can be excluded by adopting an balance-type mixer, and the frequency of f+x/n can be excluded by installing a filter or the like in the mixer 1.

Figure 3:
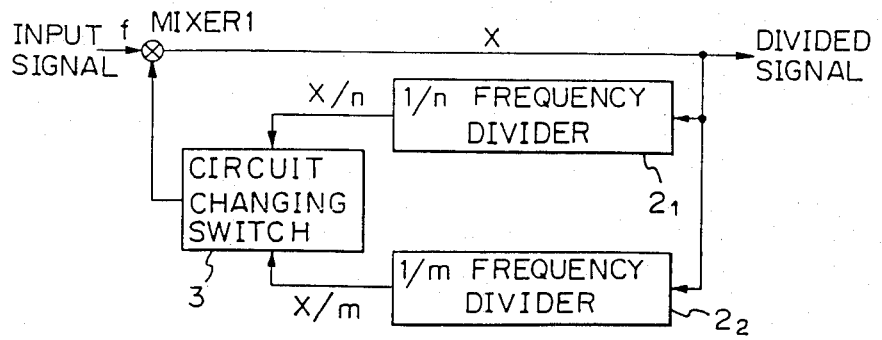
FIG. 3 is a block diagram showing of a second embodiment of a frequency divider according to the present invention.

FIG. 3 is a block diagram of a second embodiment of a frequency dividing apparatus for high frequencies, the output frequency of which is variable, according to the present invention. This frequency dividing apparatus is provided with the mixer 1, two frequency dividers $2_1$ and $2_2$ having different dividing ratios, and a circuit changing switch 3. The input terminals of the frequency dividers $2_1$ and $2_2$ are connected to one output terminal of the mixer 1, and the output terminals thereof are connected to each input terminal of the circuit changing switch 3. An output terminal of the circuit changing switch 3 is connected to the other of the input terminal of the mixer 1. The frequency dividing apparatus in FIG. 3 is a basic variable frequency dividing apparatus for high frequencies. The circuit changing switch can be provided with more input terminals, and the frequency dividers connected thereto, to provide a frequency dividing apparatus which can produce three or more divided frequencies.

If an input frequency is f, an output frequency is x, and the dividing ratios of the frequency dividers $2_1$ and $2_2$ are 1/n and 1/m, the divided frequency of n/(n+1) or m/(m+1) is obtained by switching the circuit changing switch 3, as explained with respect to FIG. 2.

Figure 4:
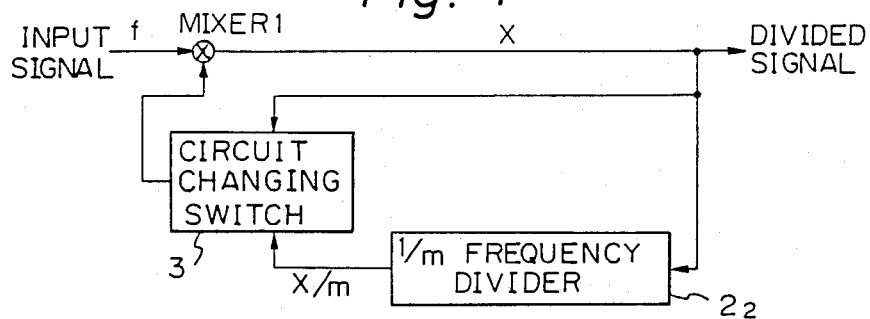
FIG. 4 is a block diagram of a modification of the second embodiment as shown in FIG. 3.

FIG. 4 is a block diagram of a modification of the second embodiment as shown in FIG. 3. In this embodiment, the dividing ratio of the frequency divider $2_1$ is set to 1 instead of 1/n. That is the frequency divider $2_1$ is replaced by a conductive circuit. According to this embodiment of the frequency dividing apparatus, the divided frequency of ½ or m/(m+1) is obtained by switching the circuit changing switch 3.

Figure 5:
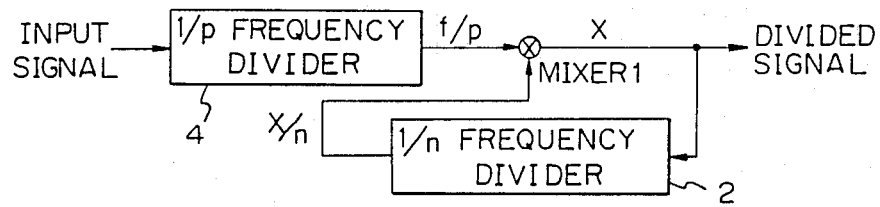
FIG. 5 is a block diagram of a third embodiment of a frequency divider according to the present invention.

FIG. 5 is a block diagram of a third embodiment of a frequency dividing apparatus according to the present invention. In this embodiment, a pre-frequency divider 4 is added at a front stage of the frequency dividing apparatus as shown in FIG. 2, and the input signal is input to the pre-frequency divider 4. The output signal of the pre-frequency divider 4 is output to the mixer 3 of the frequency divider shown in FIG. 2.

In FIG. 5, the following equation will be satisfied by the input and output of the mixer 1, where an input frequency is f, an output frequency is x, a dividing ratio of the pre-frequency divider 4 is 1/p, and a dividing ratio of the frequency divider 2 is 1/n. (The frequency applied to the mixer 1 in this embodiment is f/p.)

$$x = f/p - \frac{f/p}{n} \qquad (5-1)$$

Equation (5-1) can be modified as follows.

$$x = \frac{1}{p} \left( \frac{n}{n+1} \right) f \qquad (5-2)$$

Therefore, the frequency dividing apparatus as shown in FIG. 2 also operates as a fractional divider. Note, if the dividing ratio 1/p of the pre-frequency-divider 4 is equal to the dividing ratio 1/n of the frequency divider 2, the divided frequency x will be 1/(n+1). That is, the input frequency to the frequency dividing apparatus as shown in FIG. 5 is divided by an integral number.

Figure 6:
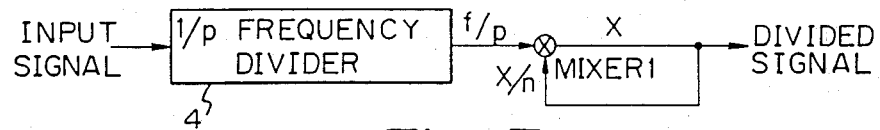
FIG. 6 is a block diagram of a modification of the third embodiment as shown in FIG. 5.

FIG. 6 is a block diagram of modification of the third embodiment as shown in FIG. 5. In this embodiment, the dividing ratio of the frequency divider 2 is set to 1 instead of 1/n, i.e., the frequency divider 2 is replaced by a conductive circuit. According to this embodiment of the frequency dividing apparatus, the divided frequency of f/2P is obtained.

Figure 7:
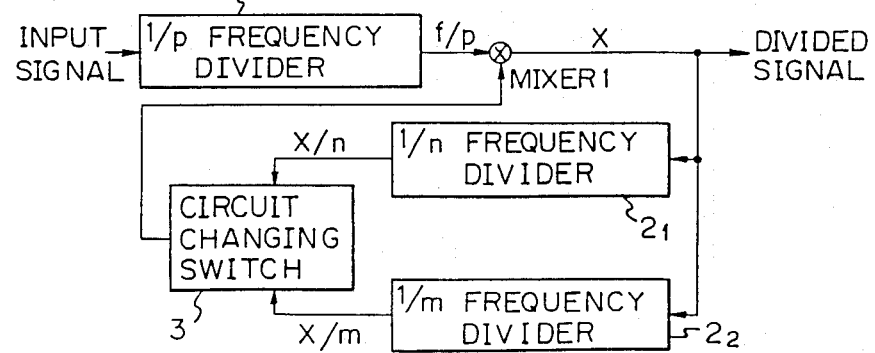
FIG. 7 is a block diagram of a fourth embodiment of a frequency divider according to the present invention.

FIG. 7 is a block diagram of a fourth embodiment of the frequency divider according to the present invention. In this embodiment, a pre-frequency divider 4 is added at a front stage of the frequency dividing apparatus as shown in FIG. 3, and thus the input signal applied to the pre-frequency divider 4 is divided before it is applied input to the mixer 1. If an input frequency is f, an output frequency is x, the dividing ratios of the frequency dividers $2_1$ and $2_2$ are 1/n and 1/m, and a dividing ratio of the pre-frequency divider 4 is 1/P. The divided frequency of fn/p(n+1) or fm/p(m+1) is obtained by switching the circuit changing switch 3, as explained in FIG. 3.

Figure 8:
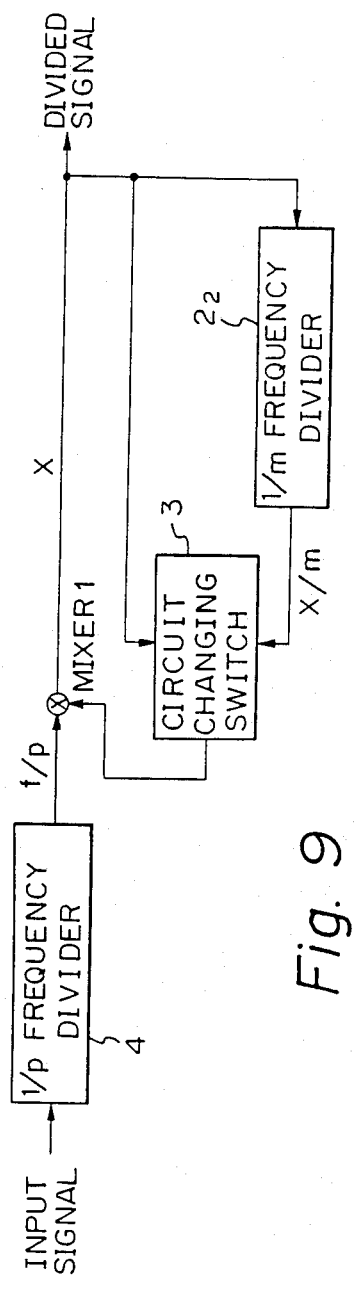
FIG. 8 is a block diagram of a modification of the fourth embodiment as shown in FIG. 6.

FIG. 8 is a block diagram of a modification of the fourth embodiment as shown in FIG. 6. In this embodiment, the dividing ratio of the frequency divider $2_1$ is set to 1 instead of 1/n. That is, the frequency divider $2_1$ is replaced by a conductive circuit. According to this embodiment of the frequency divider, the divided frequency of f/2P or fm/p(m+1) is obtained by switching the circuit changing switch 3.

In the frequency divider as shown in FIG. 7, for example, if the dividing ratios of the frequency dividers $2_1$ and $2_2$ and the pre-frequency divider 4 are set to ½, ¼, and ¼ respectively, where the input frequency is f, the divided frequency of f/5 or f/6 is obtained by switching the circuit changing switch 3 (input P=4, n=2 or 4 into the equation (5-2).

Further, in the frequency divider as shown in FIG. 8, for example, if the dividing ratios of the frequency divider 2 and the pre-frequency-divider 4 are both set to ½, where the input frequency is f, the divided frequency of f/3 or f/4 is obtained by switching the circuit changing switch 3 (input P=2, n=1 or 2 into the equation (5-2)).

Figure 9:
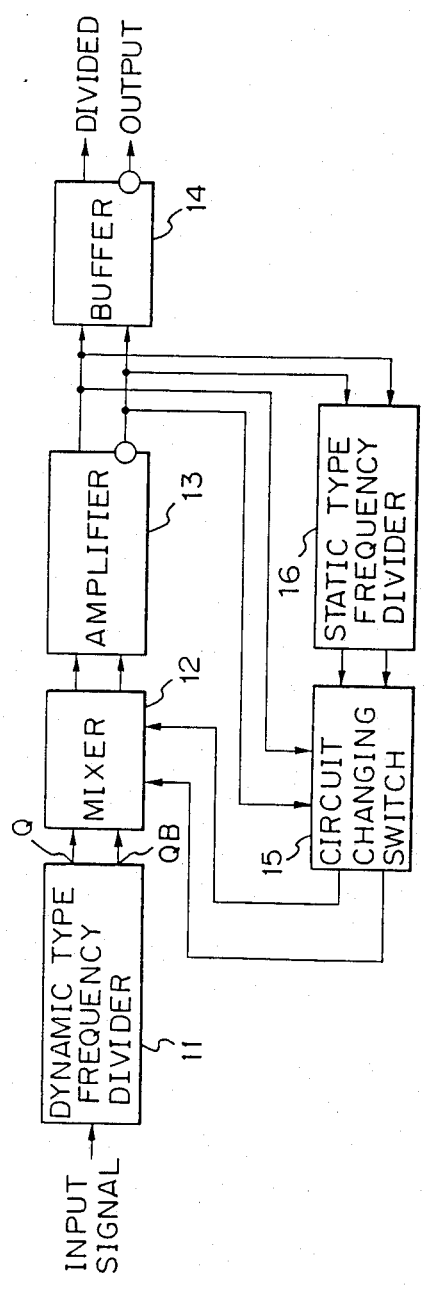
FIG. 9 is a more detailed block diagram of the fourth embodiment as shown in FIG. 6.

FIG. 9 is an embodiment of the frequency dividing apparatus as shown in FIG. 8, which can be realized as an IC (integrated circuit) by forming a MESFET (Metal Electrode Semiconductor Field Effect Transistor) on a substrate made of GaAs (Gallium arsenide). In FIG. 9, reference numeral 11 designates a dynamic-type frequency divider (shown in Japanese patent application No. 61-296809) which operates as a ½ frequency divider, reference numeral 12 designates a mixer composed of flip-flops, reference numerals 13, 14 designate differential amplifiers which compensate the mixing loss at the mixer 12 (the amplifier 14 is called a buffer), reference numeral 15 designates a circuit changing switch, and reference numeral 16 designates a static-type frequency divider usually composed of flip-flops and operating as a ½ frequency divider.

Figure 10:
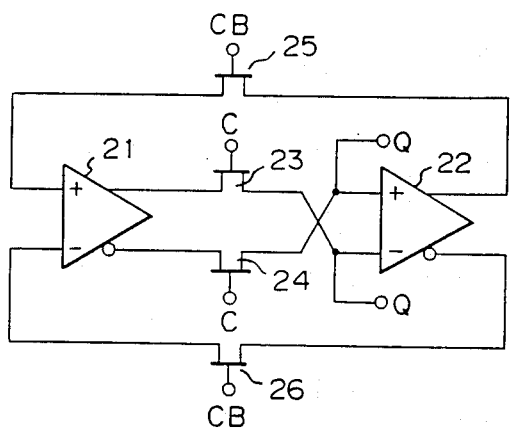
FIG. 10 is a circuit diagram of a dynamic-type frequency divider.

FIG. 10 is a circuit diagram of a dynamic-type frequency divider 11 of FIG. 9. In FIG. 10, reference numerals 21 and 22 designate differential amplifiers and reference numerals 23 to 26 designate switches composed of FETs. A normal output terminal of the differential amplifier 21 is connected to an inverted input terminal (−) of the differential amplifier 22 via the FET switch 23, and an inverted output terminal of the differential amplifier 21 is connected to a normal input terminal (+) of the differential amplifier 22 via the FET switch 24, to invert the phase of the output signal of the differential amplifier 22. Further, a normal output terminal of the differential amplifier 22 is fedback to a normal input terminal (+) of the differential amplifier 21 via the FET switch 25 and an inverted output terminal of the differential amplifier 22 is fedback to an inverted input terminal (−) of the differential amplifier 21 via the FET switch 26. A normal output terminal Q and an inverted output terminal QB of the dynamic-type frequency divider 11 are connected to the input terminals of the differential amplifier 22. The FET switches 23 to 26 are turned ON (made conductive) when a high level input signal is applied to each gate.

Under these circumstances, a ½ frequency of the input signal C can be obtained as an output signal at the output terminals Q and QB when pairs of FET switches 23 and 24, and 25 and 26, are alternately turned ON by the input signal C.

Figure 11:
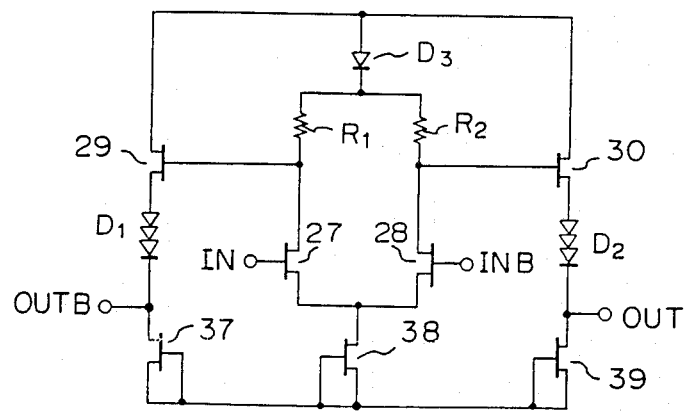
FIG. 11 is a circuit diagram of a differential amplifier.

FIG. 11 is an example of a differential amplifier shown in FIG. 10. The differential amplifier in FIG. 11 is composed of seven FETs 28 to 30 and 37 to 39, series-connected diodes $D_1$ and $D_2$ for shifting the level of the output voltage, a diode $D_3$, and two resistors $R_1$ and $R_2$. A normal input terminal IN is connected to a gate of the FET 27 and an inverted input terminal INB is connected to a gate of the FET 28. A normal output terminal OUT is connected to a cathode of the series-connected diode $D_2$ and an inverted output terminal OUTB is connected to a cathode of series-connected diode $D_1$. When differential input signals are input to the terminals IN and INB, respectively, corresponding output signals appear at the source sides of the FETs 29 and 30 connected to the drains of the FETs 27 and 28, respectively, i.e., at the terminals OUTB and OUT.

Figure 12:
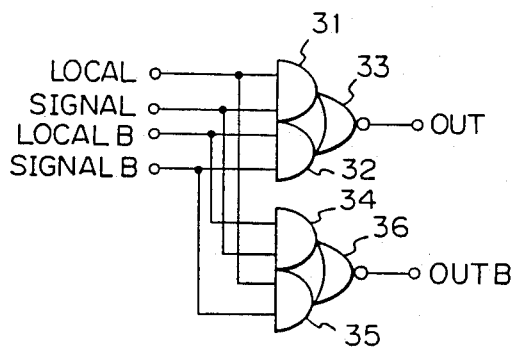
FIG. 12 is a logic circuit diagram of a mixer.

FIG. 12 is a circuit diagram of the mixer 12 of FIG. 9. In FIG. 12, reference numerals 31, 32, 34, and 35 designate AND gates, reference numerals 33 and 36 designate NOR gates, and references LOCAL, LOCALB, SIGNAL, and SIGNALB designate input signals to the mixer 12. The input signals LOCAL, LOCALB, SIGNAL, and SIGNALB are a normal signal and an inverted output signal of the dynamic-type frequency divider, and a normal output and an inverted output of the circuit changing switch, respectively. A logical product of the signals LOCAL and SIGNAL is obtained by the AND gate 31, a logical product of the signals LOCALB and SIGNALB is obtained by the AND gate 32, a logical product of the signals LOCALB and SIGNAL is obtained by the AND gate 34, and a logical product of the signals LOCAL and SIGNALB is obtained by the AND gate 32. The NOR gate 33 then logically adds the output signals of the AND gates 31 and 32 and outputs the added signal after inverting. The NOR gate 36 also logically adds the output signals of the AND gates 34 and 35 and outputs the added signal after inverting the added signal. As a result, an exclusive OR of the input signals LOCAL and SIGNAL is obtained at an output terminal OUT of the NOR gate 33 and an inverted output signal of the NOR gate 33 is obtained at an output terminal OUTB of the NOR gate 36. That is, the logical circuit in FIG. 12 is constructed as a exclusive OR circuit, and thus is made to operate as a mixer by the multiplicative action of the exclusive OR circuit.

Figure 13:
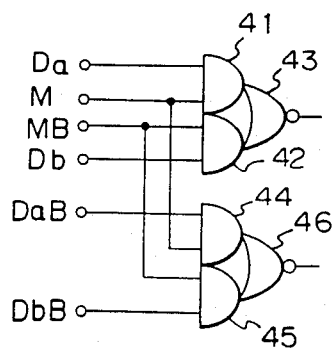
FIG. 13 is a logic circuit diagram of a circuit changing switch.

FIG. 13 is an example of a circuit changing switch 15 of FIG. 9. In FIG. 13, reference numerals 41, 42, 44, and 45 designate AND gates, reference numerals 43 and 46 designate NOR gates, references Da, Db, DaB, and DbB designate data signals, and references M and MB designate control signals. The data signals Da, Db, DaB, and DbB are input to one input terminal of the AND gates 41, 42, 44, and 45 respectively, the control signal M is input to the other input terminal of the AND gates 41 and 44, and the control signal MB is input to the other input terminal of the AND gates 42 and 45. The output signals of the AND gates 41 and 42 are input to the NOR gate 43, and the output signals of the AND gates 44 and 45 are input to the NOR gate 46. As a result, when the control signal M is high level and the control signal MB is low level, the data signals Da and DaB appear at the outputs of the NOR gates 46 and 43, respectively. When the control signal M is low level and the control signal MB is high level, the data signals Db and DbB appear at the outputs of the NOR gates 46 and 43, respectively. Accordingly, the logical circuit in FIG. 13 operates as a circuit changing switch.

Figure 14:
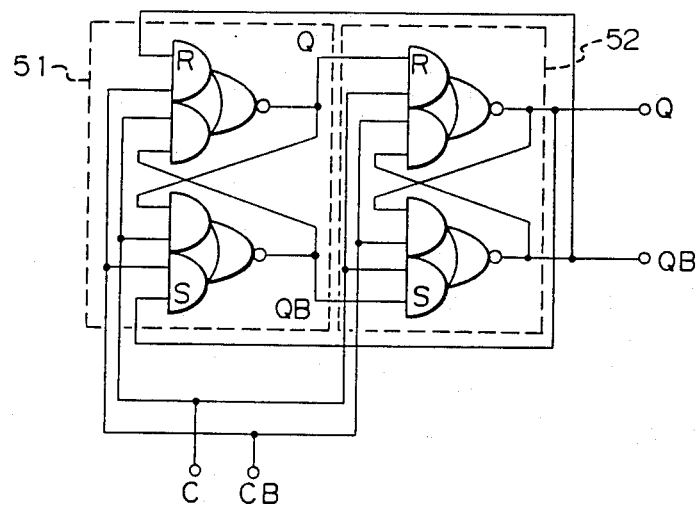
FIG. 14 is a circuit diagram of a static-type frequency divider.

FIG. 14 is a circuit diagram of the static-type frequency divider 16 of FIG. 9. The static-type frequency divider 16 includes two RS flip-flops 51 and 52, each of which is constructed by a pair of logical circuits including two AND gates and a NAND gate. An input S of the flip-flop 51 is connected to a normal output Q of the flip-flop 52, an input R of the flip-flop 51 is connected to an inverted output QB of the flip-flop 52, an input S of the flip-flop 52 is connected to an inverted output QB of the flip-flop 51, and an input R of the flip-flop 52 is connected to a normal output Q of the flip-flop 52. Further, signals C and CB are input to each logical circuit. As a result, the output of the flip-flops 51 and 52 are inverted alternately by the input of the control signals C and CB, and thus the frequencies of the signals C and CB are divided to ½ and appear at the outputs Q and QB of the flip-flop 52.

Figure 15:
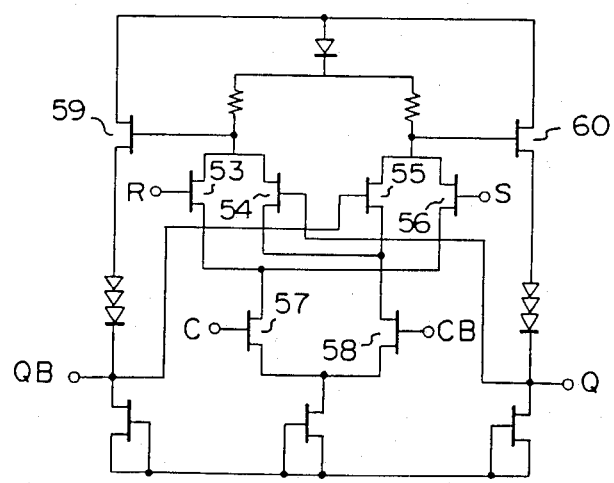
FIG. 15 is a circuit diagram of a flip-flop.

FIG. 15 is a circuit diagram of the flip-flop shown in FIG. 14. The flip-flop in FIG. 15 includes three differential amplifiers each of which comprises a pair of FETs 53 and 54, 55 and 56, and 57 and 58. The source of the FET, 53 and 56, the phases of which are different, and the drain of the FET 57 are connected together, and the source of the FETs 54 and 55, the phases of which are different, and the drain of the FET 58 are connected together. Also, the drain of the FETs 53 and 54 and the drain of FETs 55 and 56 are connected together. Each of the connecting points is connected respectively to the gates of the FETs 59 and 60, which form a source follower. In this circuit, the input R is connected to the gate of the FET 53, the input S is connected to the gate of the FET 56, the output Q is connected to the connecting point of the source of the FET 60 and the gate of the FET 54, and the output QB is connected to the connecting point of the source of the FET 59 and the gate of the FET 55. The signals C and CB are input to the bases of the FETs 57 and 58, respectively, and the output signals Q and QB are inverted at every input of the signals C and CB. Thus the flip-flop circuit operates as a master-slave type flip-flop.

Figure 16:
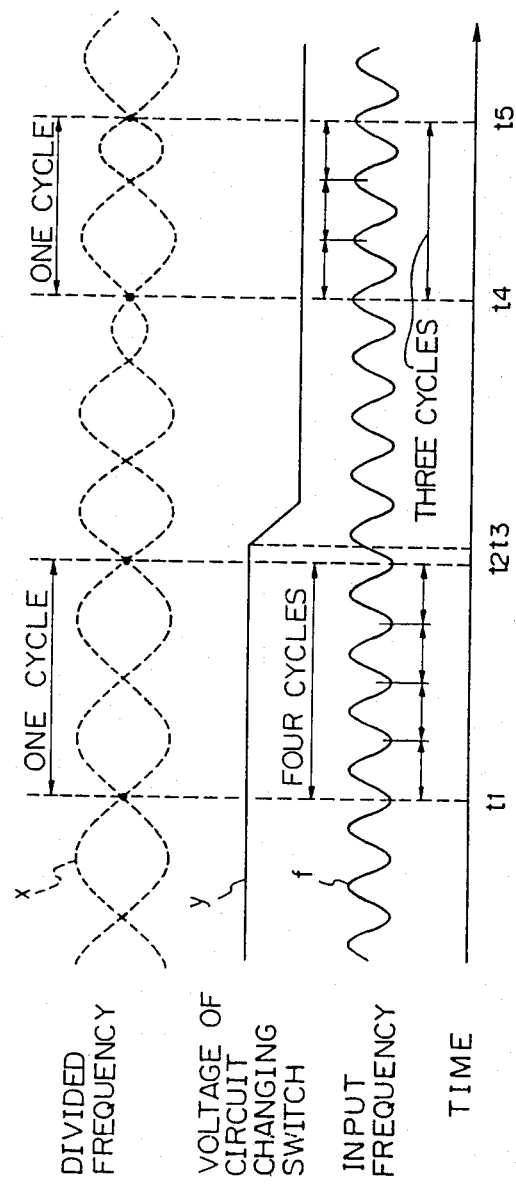
FIG. 16 is a waveform diagram for explaining the operation of the frequency divider as shown in FIG. 8.

FIG. 16 is a waveform diagram for explaining the operation of the frequency dividing apparatus as shown in FIG. 8. These waveforms are obtained by a simulation, wherein each gate is made of Au/WSi and each gate length is 1 μm. In this simulation, a frequency of 7 GHz is input as an input signal, and the dividing ratio of the frequency divider 2 and the pre-frequency divider 4 are both set to ½, so that a 7/3 GHz or 7/4 GHz divided frequency is obtained as an output signal. In FIG. 16, the wave form f indicates an input frequency, the wave form x indicates an output frequency, and the wave form y indicates a signal input to the circuit changing switch 15. The time t3 indicates the switching of the circuit changing switch 15, and the feedback frequency from the amplifier 13 is directly applied to the mixer 12 before the time t3 where the total dividing ratio of the input frequency is ¼. Then, the frequency fedback from the amplifier 13 is applied via the static-type frequency divider 16, where the total dividing ratio of the input frequency is ⅓. In the time period from t1 to t2 the input frequency f has four cycles and one frequency is output. In the time period from t4 to t5 the input frequency f has three cycles and one frequency is output. Accordingly, it can be undestood that the divided frequency of f/3 or f/4 is obtained by switching the circuit changing switch 3.

Note, the Au/TiN/W-Si-Gate is explained in: Au/TiN/W-Si-Gate Self-Aligned GaAs MESFETs Using Rapid Terminal Annealing Method, Shegaki et al. Electronics Letters 1985, Vol. 21, No. 18, p. 804.

Further, with regard to the pre-frequency divider 4 shown in FIGS. 5, 6, 7, and 8, a dynamic-type frequency divider having a fixed frequency dividing ratio can be used as shown in FIG. 9, a static-type frequency divider having a fixed frequency dividing ratio, or an analog-type frequency dividing apparatus having a variable frequency dividing ratio as shown in FIG. 7 of the present invention, can be used.

The many features and advantages of the invention are apparent from the detailed specification and thus, it is intended by the appended claims to cover all such features and advantages that fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to falling within the scope of the invention.

We claim:

1. A frequency dividing apparatus having an input signal terminal and a divided signal terminal, said apparatus comprising:
    a mixer, having a first input terminal connected to the input signal terminal, having a second input terminal, and having an output terminal connected to the divided signal terminal, for mixing two signals input to said first and second input terminals and outputting a mixed signal to said output terminal;
    a circuit changing switch having a plurality of input terminals and one output terminal connected to said second input terminal of said mixer, for selecting a circuit to be connected to said input terminals thereof; and
    one or more frequency dividers having a different fixed frequency dividing ratio, each of said frequency dividers having an input terminal connected to the divided signal terminal and an output terminal connected to one of said input terminals of said circuit changing switch.

2. An apparatus as set forth in claim 1, wherein one of said input terminals of said circuit changing switch is directly connected to the divided signal terminal.

3. An apparatus as set forth in claim 2, further comprising an additional frequency divider having an input terminal connected to the input signal terminal and an output terminal connected to said first input terminal of said mixer.

4. An apparatus as set forth in claim 3, wherein said additional frequency divider comprises a static-type divider having a fixed frequency dividing ratio.

5. An apparatus as set forth in claim 3, wherein said additional frequency divider comprises a dynamic-type divider having a fixed frequency dividing ratio.

6. An apparatus as set forth in claim 3, wherein said additional frequency divider comprises an analog-type divider having a variable frequency dividing ratio.

7. An apparatus as set forth in claim 1, further comprising an additional frequency divider having an input terminal connected to the input signal terminal and an output terminal connected to said first input terminal of said mixer.

8. An apparatus as set forth in claim 7, wherein said additional frequency divider comprises a static-type divider having a fixed frequency dividing ratio.

9. An apparatus as set forth in claim 7, wherein said additional frequency divider comprises a dynamic-type divider having a fixed frequency dividing ratio.

10. An apparatus as set forth in claim 7, wherein said additional frequency divider comprises an analog-type divider having a variable frequency dividing ratio.

11. An apparatus as set forth in claim 9, further comprising:
    an amplifier connected between said mixer and said circuit changing switch and said one or more frequency dividers; and
    a buffer connected between said amplifier and the divided signal terminal.

* * * * *

UNITED STATES PATENT AND TRADEMARK OFFICE
CERTIFICATE OF CORRECTION

PATENT NO. : 4,855,895

DATED : AUGUST 8, 1989

INVENTOR(S) : MASAFUMI SHIGAKI ET AL.

It is certified that error appears in the above-identified patent and that said Letters Patent is hereby corrected as shown below:

Col. 1, line 21, "also mobile" should be --also other mobile--.

Col. 4, line 52, delete "applied".

Col. 5, line 5, "(5-2)." should be --(5-2)).--.

Col. 7, line 56, "Shegaki et al." should be --Shigaki et al.--.

Signed and Sealed this

Seventeenth Day of July, 1990

*Attest:*

HARRY F. MANBECK, JR.

*Attesting Officer*

*Commissioner of Patents and Trademarks*